US006175633B1

(12) United States Patent
Morrill et al.

(10) Patent No.: US 6,175,633 B1
(45) Date of Patent: Jan. 16, 2001

(54) RADIO COMMUNICATIONS APPARATUS WITH ATTENUATING EAR PIECES FOR HIGH NOISE ENVIRONMENTS

(75) Inventors: Jeffrey C. Morrill, Platte City; Gerald J. Jonas, Raytown, both of MO (US)

(73) Assignee: Cavcom, Inc., Kansas City, MO (US)

( * ) Notice: Under 35 U.S.C. 154(b), the term of this patent shall be extended for 0 days.

(21) Appl. No.: 08/835,602

(22) Filed: Apr. 9, 1997

(51) Int. Cl.[7] ............................. A61F 11/06; H03B 29/00; H03G 3/20; H04R 3/00
(52) U.S. Cl. ..................... 381/71.6; 381/110; 381/328; 367/198
(58) Field of Search ................................. 381/71.6, 328, 381/110, 72, 312, 323; 455/569, 570, 575, 90, 100, 351; 367/198, 199

(56) References Cited

U.S. PATENT DOCUMENTS

| Re. 33,017 | 8/1989 | Bellafiore . |
|---|---|---|
| 4,017,797 | 4/1977 | Laessig . |
| 4,150,262 | 4/1979 | Ono . |
| 4,315,111 | 2/1982 | Thomas . |
| 4,323,999 | 4/1982 | Yoshizawa et al. . |
| 4,334,315 | 6/1982 | Ono et al. . |
| 4,349,083 | 9/1982 | Bennett . |
| 4,392,244 | 7/1983 | Yoshizawa et al. . |
| 4,412,096 | 10/1983 | Edgerton et al. . |
| 4,426,733 | 1/1984 | Brenig . |
| 4,516,428 | 5/1985 | Konomi . |
| 4,520,236 | 5/1985 | Gauthier . |
| 4,588,867 | 5/1986 | Konomi . |
| 4,622,440 | 11/1986 | Slavin . |
| 4,654,883 | 3/1987 | Iwata . |
| 4,712,245 | 12/1987 | Lyregaard . |
| 4,720,857 | 1/1988 | Burris et al. . |
| 4,735,759 | 4/1988 | Bellafiore . |
| 4,800,636 | 1/1989 | Topholm . |
| 4,833,719 | 5/1989 | Carme et al. . |
| 4,834,211 | 5/1989 | Bibby et al. . |
| 4,852,177 | 7/1989 | Ambrose . |
| 4,869,339 | 9/1989 | Barton . |
| 4,871,502 | 10/1989 | LeBisch et al. . |
| 4,941,187 | 7/1990 | Slater . |
| 4,962,537 | 10/1990 | Basel et al. . |
| 4,972,468 | 11/1990 | Murase et al. . |
| 4,972,491 | 11/1990 | Wilcox, Jr. . |

(List continued on next page.)

FOREIGN PATENT DOCUMENTS

| 100080A | 2/1984 | (EP) . |
|---|---|---|
| 564874A1 | 10/1993 | (EP) . |
| 52-37421 | 3/1977 | (JP) . |
| 55-147040 | 11/1980 | (JP) . |
| 56-32833A | 4/1981 | (JP) . |
| 58-156233 | 9/1983 | (JP) . |
| 58-182398 | 10/1983 | (JP) . |
| 59-209000 | 11/1984 | (JP) . |
| 1-176199A | 7/1989 | (JP) . |
| 2-56121A | 2/1990 | (JP) . |
| 3-289724A | 12/1991 | (JP) . |
| 6-30490A | 2/1992 | (JP) . |
| 4-68799A | 3/1992 | (JP) . |
| 5-276587A | 10/1993 | (JP) . |

* cited by examiner

Primary Examiner—Forester W. Isen
Assistant Examiner—Xu Mei
(74) Attorney, Agent, or Firm—Hovey, Williams, Timmons & Collins

(57) ABSTRACT

A preferred communications apparatus includes a pair of ear units coupled with a control unit that can be connected to a radio transceiver for delivery of audio signals therebetween. The control unit includes a VOX circuit. Each ear unit includes a transducer operable as an earphone, and one of the ear units is operable as a microphone. Additionally, each ear unit includes an ear piece configured for attenuating ambient sound and signal sufficiently to meet safety standards and sufficiently to prevent attenuated ambient sound from triggering the VOX circuit.

19 Claims, 2 Drawing Sheets

U.S. PATENT DOCUMENTS

| | | |
|---|---|---|
| 4,975,967 | 12/1990 | Rasmussem . |
| 5,008,954 | 4/1991 | Oppendahl . |
| 5,031,219 | 7/1991 | Ward et al. . |
| 5,101,504 | 3/1992 | Lenz . |
| 5,109,410 | 4/1992 | Suhami et al. . |
| 5,146,051 | 9/1992 | Hermann . |
| 5,164,984 | 11/1992 | Suhami et al. . |
| 5,166,659 | 11/1992 | Navarro et al. . |
| 5,182,774 | 1/1993 | Bourk . |
| 5,195,139 | 3/1993 | Gauthier . |
| 5,208,867 | 5/1993 | Stites, III . |
| 5,220,612 | 6/1993 | Tibbetts et al. . |
| 5,230,089 | 7/1993 | Kindinger et al. . |
| 5,251,263 | 10/1993 | Andrea et al. . |
| 5,251,326 | 10/1993 | Silverman . |
| 5,282,253 | 1/1994 | Konomi . |
| 5,298,692 | 3/1994 | Ikeda et al. . |
| 5,321,757 | 6/1994 | Woodfill, Jr. . |
| 5,327,461 | 7/1994 | Kushige . |
| 5,327,506 * | 7/1994 | Stites, III ............................. 381/355 |
| 5,343,523 | 8/1994 | Bartlett et al. . |
| 5,345,509 | 9/1994 | Hofer et al. . |
| 5,357,576 | 10/1994 | Arndt . |
| 5,390,254 | 2/1995 | Adelman . |
| 5,395,168 | 3/1995 | Leenen . |
| 5,396,563 | 3/1995 | Yoshimi . |
| 5,404,577 | 4/1995 | Zuckerman et al. . |
| 5,420,930 | 5/1995 | Shugart, III . |
| 5,426,719 * | 6/1995 | Franks et al. ......................... 704/233 |
| 5,438,702 | 8/1995 | Jackson . |
| 5,440,082 | 8/1995 | Claes . |
| 5,448,637 | 9/1995 | Yamaguchi et al. . |
| 5,479,522 | 12/1995 | Lindemann et al. . |
| 5,610,988 * | 3/1997 | Miyahara ............................. 381/312 |
| 5,636,285 * | 6/1997 | Sauer ................................... 381/312 |
| 5,699,436 * | 12/1997 | Claybaugh et al. ................. 381/71.6 |
| 5,721,783 * | 2/1998 | Anderson ............................. 381/316 |
| 5,732,143 * | 3/1998 | Andrea et al. ...................... 381/71.7 |
| 5,740,258 * | 4/1998 | Goodwin-Johansson et al. .... 381/72 |
| 5,771,278 * | 6/1998 | Brown ............................... 379/93.26 |
| 5,911,314 * | 6/1999 | Urella et al. ......................... 381/372 |

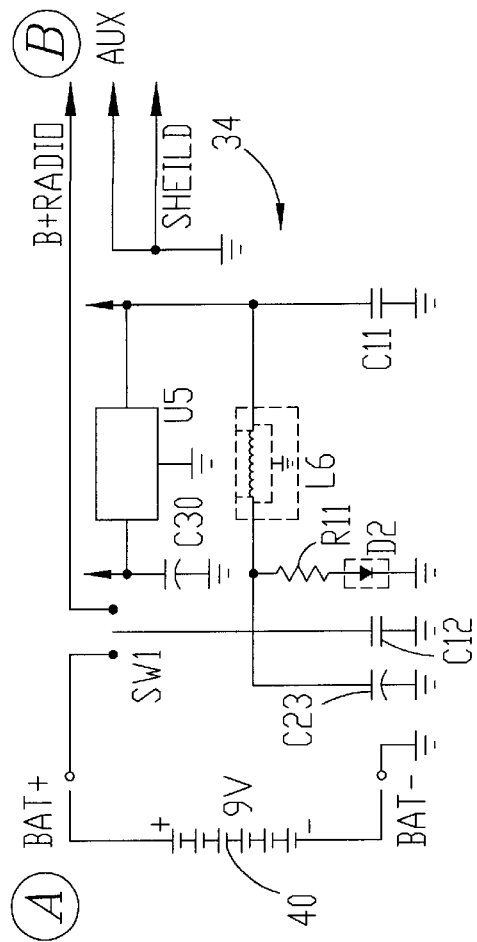
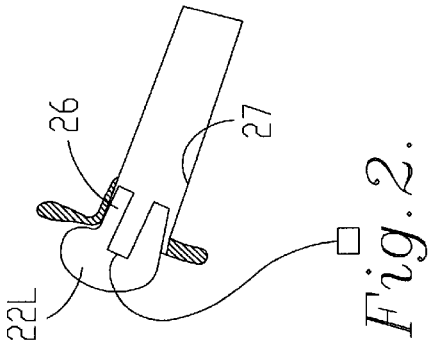
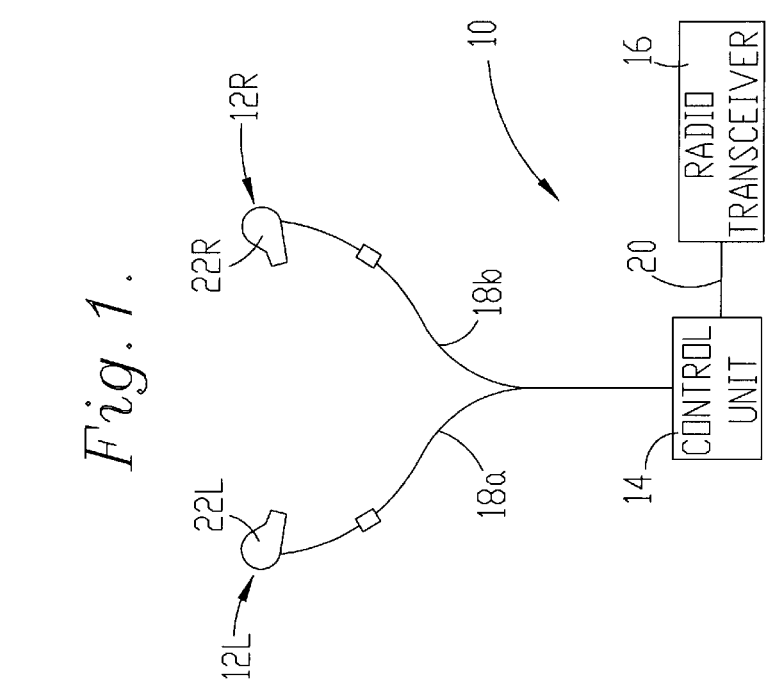

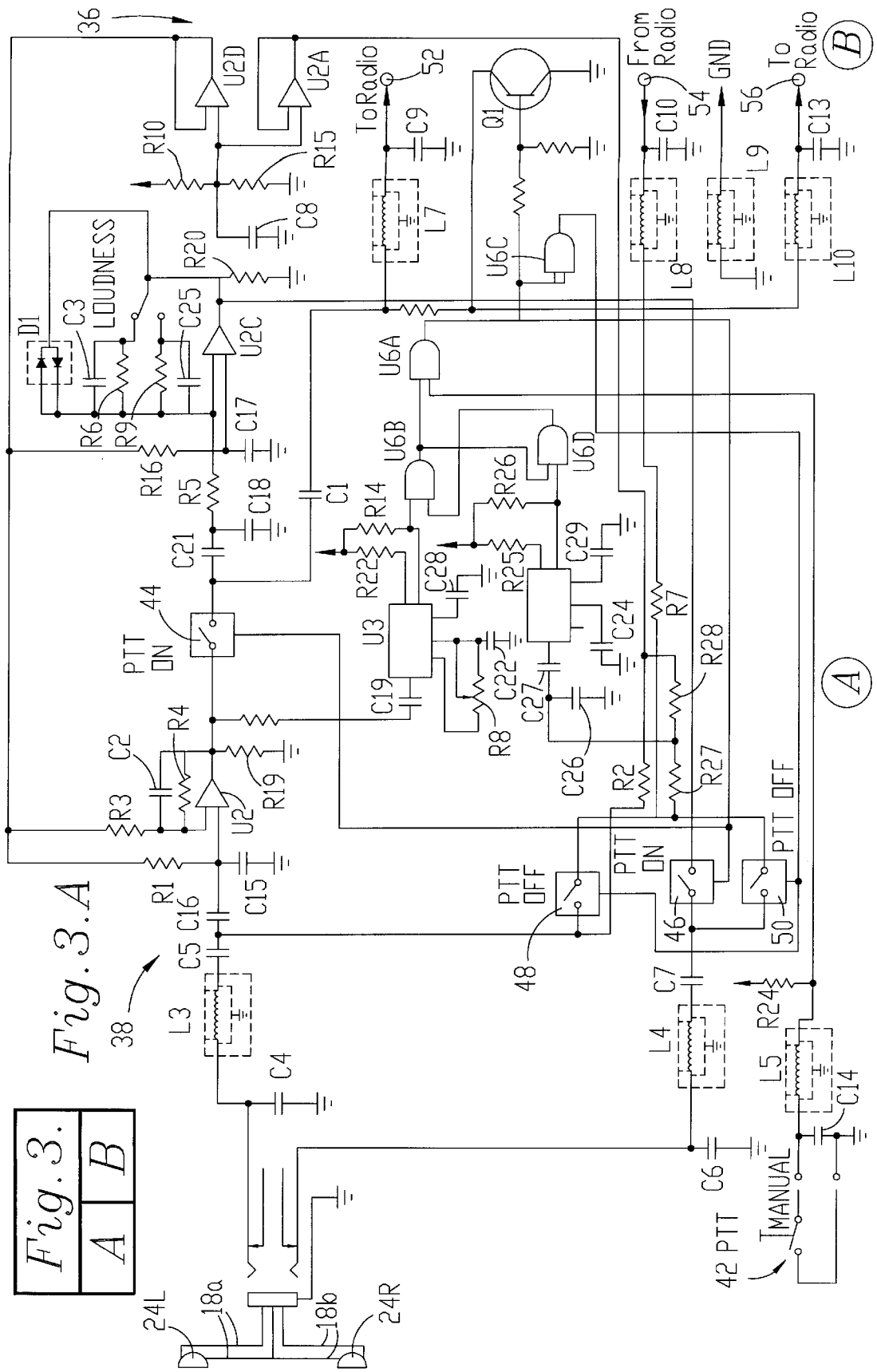
Fig. 3.A

RADIO COMMUNICATIONS APPARATUS WITH ATTENUATING EAR PIECES FOR HIGH NOISE ENVIRONMENTS

RELATED APPLICATIONS

Not applicable.

FEDERALLY SPONSORED RESEARCH OR DEVELOPMENT

Not applicable.

MICROFICHE APPENDIX

Not applicable.

BACKGROUND OF THE INVENTION

1. Field of the Invention

The present invention relates to the field of radio communication devices. In particular, the invention is concerned with a preferred communications apparatus including a pair of ear units coupled with a VOX-triggered control unit that can be connected to a radio transceiver for delivery of audio signals therebetween.

2. Description of the Prior Art

Radio communication in a high noise environment has been a problem in the prior art. One prior art device includes headphones that fit over and enclose a person's ears in order to attenuate ambient sound and to allow the wearer to hear incoming transmissions. A boom microphone is provided for outgoing communications but such transmissions also include the ambient sounds. Additionally, the headsets are bulky and heavy, and do not provide a good seal against ambient sounds for people who wear eye glasses or other protective gear such as hard hats, face shields, respirators and so forth.

Other prior art devices use transducers configured to fit within the ear canal of the person and some include bone conduction microphones allowing two-way communications. Also, these prior art devices do not limit the loudness of the audio signals thereby adding to the noise exposure of the wearer with potential damage to the wearer's hearing. Moreover, these prior art devices do not provide sufficient attenuation of ambient sounds to satisfy safety requirements.

SUMMARY OF THE INVENTION

The present invention solves the prior art problems discussed above and provides a distinct advance in the state of the art. More particularly, the communications apparatus hereof provides a transmit-and-receive radio communications system that is practical for high noise environments while meeting the safety standards to protect the wearer's hearing.

The preferred embodiment of the present invention includes a pair of ear units that can be coupled with a VOX-triggered control unit which, in turn, can be coupled with a radio transceiver. Each preferred ear unit includes an earphone transducer and at least one of the transducers also functions as a microphone. Additionally, each ear unit includes an ear piece configured to attenuate ambient sound sufficiently to meet safety standards and to prevent triggering of the VOX circuit.

In the preferred embodiment, only one of the transducers includes a microphone and the control unit is operable to provide a side tone to the other transducer as feedback. Other preferred aspects of the present invention are disclosed herein.

BRIEF DESCRIPTION OF THE DRAWINGS

FIG. 1 is a schematic illustration of a preferred communications apparatus in accordance with the present invention;

FIG. 2 is a schematic illustration of the preferred ear unit of FIG. 1 shown positioned in the ear of a person; and FIG. 3 is an electrical schematic diagram of the control unit of FIG. 1.

DETAILED DESCRIPTION OF THE PREFERRED EMBODIMENT

Referring to the drawing figures and in particular to FIG. 1, preferred communications apparatus 10 includes ear units 12L and 12R, control unit 14 and radio transceiver 16. Lines 18a and 18b interconnect ear units 12L and 12R with control unit 14 and cable 20 interconnects control unit 14 and radio transceiver 16.

Ear units 12L and 12R include respective ear pieces 22L and 22R and transducers 24L and 24R received within ear pieces 22L and 22R. Ear pieces 22L,R are custom molded to a person's ears and formed of material that remains soft and resilient in order to provide attenuation of ambient sound and for wearer comfort. Each ear piece 22L,R includes an ear canal portion 26 configured for extending into the ear canal 27 (FIG. 2) of the wearer with opening 28 defined at the end of portion 26 in order to expose transducers 24L,R to ear canal 27.

To form ear pieces 22L,R, an initial impression is made of a person's ears using conventional material designed for this purpose such as 2-part, polysiloxan (silicone) or polyvinylsiloxane (vinyl), with a portion of the impression extending into the person's ear canal. A plaster or gelatinous casting is then made from the impression and this casting is used as part of a mold into which the ear piece material is poured. The preferred ear piece material is medical grade silicone. After curing, the ear piece material is drilled to create an interior space for a transducer. After installation of the transducer and connecting wires, the remaining space is back-filled with silicone.

When completed, the ear piece conforms to and engages the contours of the user's ear adjacent the opening thereto. With this close fit, no other device is needed to retain the ear piece in place and no vent or passage is provided that would allow ambient noise to pass through the ear piece unattenuated. In this way, each ear piece 22L,R provides sufficient attenuation to protect the person's hearing and to meet safety standards. Additionally, the attenuation is sufficient to prevent triggering of the VOX circuit in control unit 14 as discussed further herein.

The following is a chart illustrating the attenuation data for preferred ear pieces 22L,R in accordance with ANSI Specifications S3. 19-1974:

| FREQUENCY HZ | 125 | 250 | 500 | 1000 | 2000 | 3150 | 4000 | 6300 | 8000 |
|---|---|---|---|---|---|---|---|---|---|
| Mean Value | 31.5 | 32.5 | 32.3 | 29.9 | 34.3 | 41.0 | 40.7 | 45.0 | 44.3 |
| Std. Deviation | 8.8 | 8.7 | 8.2 | 5.5 | 3.5 | 4.7 | 5.0 | 4.1 | 3.5 |

In particular, ear pieces 22L,R provide a Noise Reduction Rating (NRR or an EPA NRR) of 20 decibels (dB.). This amount of attenuation is critical in order to meet safety standards, to ensure that the wearer's hearing is protected in a high noise environment, that the wearer can hear the audible outputs from transducers 24L,R, and also critical that the ambient sound is attenuated sufficiently to prevent triggering of the VOX circuit in control unit 14. Moreover, it is critical that the wearer's sustained exposure be also limited generally to 95 dB in order to meet safety standards and to protect the wearer's hearing.

Preferred transducers 24L,R are KNOWLES BJ Series Model 1591 and are operable to function as both an earphone (or speaker) and a microphone. In the preferred embodiment, transducers 24L,R are connected to control unit 14 so that only one of the transducers, such as transducer 24L, operates as both a earphone and a microphone. The other transducer, such as transducer 24R, operates only as an earphone.

With this arrangement, the person wearing ear unit 12L,R will hear incoming communications in both ears, which can be important in a high noise environment. When transmitting, transducer 24L provides the microphone function while a side tone of the wearer speaking is provided by transducer 24R so that the wearer can hear himself or herself speaking. This provides feedback to the wearer indicating that control unit 14 is operating and feedback concerning the wearer's speaking volume. It will be appreciated, however, that both transducers could be connected to use the earphone and microphone capabilities, if desired. In an alternative arrangement, one transducer could be used as a microphone only and the other could be used as an earphone only.

Each of lines 18a,b is a two wire pair with one end connected to a respective transducer and with the other ends terminating in a conventional jack for removable attachment with control unit 14. Each line 18a,b also includes a connector 32 allowing ear units 12L,R to be disconnected from lines 18a,b with a short pig tail extending from each ear unit 12L,R.

Radio transceiver 16 is a conventional two-way radio such as Motorola Model HT1000. Detachable cable 20 interconnects control unit 14 and transceiver 16 allowing for transmission of audio signals therebetween. Cable 20 can also be used for providing power from transceiver 16 to control unit 14. This arrangement is preferred because the preferred transceiver includes a rechargeable battery.

FIG. 3 is an electrical schematic diagram showing the preferred electrical components and configuration of control unit 14. In general, control unit 14 allows VOX triggering of transceiver 16, provides side tone to the wearer during transmissions, allows manual push-to-talk (PTT) operation, and enables adjustment of VOX sensitivity and side tone loudness.

Control unit 14 includes power circuit 34, reference voltage circuit 36 and control circuit 38. Switch SW1 allows the user to select internal battery 40 as the power source or radio transceiver 16 as the power source. The selected power supply voltage is conditioned by capacitors C23 (10uF), C12 (0.22uF) and C11 (0.22uF) along with filter L6 connected as shown to provide supply voltage +V. Filter L6 and the other L filters shown in FIG. 3 are type NFM51R00106 available from Murata Erie Corp. LED D3 is in series with resistor R11 (7.5K) and provides a visual indication that power is available to control unit 14. Device U5 (LM78L05) receives input +V and provides an output connected with capacitor C30 (10uF) at +5V.

Reference voltage circuit 36 includes amplifiers U2D (type LM324M) and U2A (type LM324M) along with resistors R10 (100K) and R15 (100K), and capacitor C8 (0.22uF) connected as shown to supply voltage +V. Circuit 36 provides stable reference and supply voltage to control circuit 38.

Control circuit 38 includes manual PTT switch 42, solid state PTT "on" switches 44 and 46 (type 74HC4066S), solid state PTT "off" switches 48 and 50 (type 74HC4066S) and VOX devices U3 and U4 (type NJM2072E available from New Japan Radio Company) along with the other components illustrated in FIG. 3. PTT switch 42 is normally open (push-to-close) and is connected to one input of NAND U6A with capacitor C14 (0.1uF) and filter L5 connected as shown along with pull up resistor R24 (15K) connected to supply +5V.

Control circuit 38 provides audio signals to transducer 16 at terminal 52, receives audio signals from transducer 16 at terminal 54, and provides a signal at terminal 56 to key transceiver 16 to transmit. Additionally, control circuit 38 is connected to transducers 24L,R by lines 18a,b.

For operation, transducers 24L,R, control unit 14 and radio transceiver 16 are connected as shown and energized. Initially, PTT switch 42 is open as are "on" switches 44. PTT "off" switches 48 are closed and VOX devices U3 and U4 are not triggered. As a result, VOX device terminals OUT2 are logic low to NAND gates U6B and U6D. As illustrated, these gates are connected to perform a modified OR function.

With the VOX devices untriggered, the output from gate U6B is logic high to one input of NAND U6A. The other input to this gate is logic high with PTT switch 42 open. Thus, the output from gate U6A is logic low to PTT "on" switches 44,46 and these switches are open. The logic low output from gate U6A is provided to both inputs of NAND U6C, which functions as an inverter. The output from gate U6C is thereby logic high to PTT "off" switches 48, 50 causing these switches to be closed.

Incoming audio signals from transceiver 16 are received at terminal 54 and provided to PTT "off" switches 48, 50 by way of capacitor C10 (0.1uF), filter L8 and resistor R7 (10K). The audio signals received from transducer 16 are sufficient to drive an 8 ohm speaker and resistor R7 attenuates these signals to a level suitable for transducers 24L,R. In particular, resistor R7 attenuates the incoming audio signals sufficiently to prevent the audible sound delivered by transducers 24L,R from exceeding 95 decibels, which is critical to protect the hearing of the wearer and to meet safety standards.

With PTT "off" switch 48 closed, the incoming audio signals are provided to transducer 24L by way of capacitors C5 (0.22uF) and C4 (0.1uF), filter L3 and lines 18a connected as shown. Similarly, the audio signals are provided to transducer 24R by way of capacitors C7 (0.22uF) and capacitor C6 (0.1uF), filter L4 and lines 18b connected as shown.

The incoming audio signals provided to switches 48,50 are also provided to the IN terminal of VOX device U4 by way of resistor R27 (330 ohms) and capacitors C26 (0.001uF) and C27 (0.1uF). This causes terminal OUT 2 to change to logic high as one input to device U6D. This prevents VOX device U3 from changing the state of PTT switches 44–50 during incoming audio signals. That is, VOX device U3 cannot trigger a shift to the transmission mode during incoming audio.

Capacitor C29 (10uF) is connected to terminal CREC of device U4 and provides for a two second delay on drop out in order to disable VOX triggered transmissions for two seconds after incoming audio signals stop. This allows for typical speaking pauses and prevents multiple units from stepping on the transmissions of one another. VOX device U4, however, does not disable manual PTT switch 42. Thus, operation of this switch overrides the disabling function of VOX device U4. In this way, the user of apparatus 10 can make priority transmissions without waiting for a pause in traffic.

Capacitor C24 (0.001uF) is connected to terminal AMP of device U4. Supply voltage for pull up to logic high is connected to terminals OUT1 and OUT2 of device U4 by way of respective pull up resistors R25 and R26 (both 15K).

If the person using apparatus 10 wishes to initiate a manual PTT transmission, the person pushes PTT switch 42 which closes to provide logic low to the corresponding input of gate U6A. The output from this gate goes logic high which in turn closes PTT "on" switches 44,46. Gate U6C inverts the signal to logic low which opens PTT "off" switches 48,50.

When the user speaks, transducer 24L provides audio signals representative thereof by way of lines 18a to amplifier U2B by way of filter L3, capacitor C5 and capacitors C16 (0.01uF) and C15 (0.001uF). As illustrated in FIG. 3, audio signals from transducer 24R are not processed for transmission. Amplifier U2B is also connected to resistors R1 (100K), R3 (100K), R4 (470K) and R19 (10K) and to capacitor C2 (1000pF) connected as shown to provide supply voltage to amplifier U29 and to determine the gain thereof. The output from amplifier U2B is delivered to terminal 52, and from there to radio transceiver 16, by way of capacitor C1 (0.47uF), filter L7 and capacitor C9 (0.001uF) connected as shown.

With closure of manual PTT switch 42, the logic high signal from gate U6A is provided to the base of transistor Q1 (type MMBT222A) by way of resistors R12 and R13 (both 15K). As a result, transistor Q1 turns on and shorts terminal 56 to ground by way of capacitor C13 (0.1uF) and filter L10 connected as shown. This provides a signal to transceiver 16 to key radio transmission. Resistor R17 (2.2K interconnects the collector of transistor Q1 with terminal 52.

In order to provide side tone to transducer 24R, the output from amplifier 29 is also delivered to the negative input terminal of amplifier U2C by way of capacitors C21 (0.22uF) and C17 (0.001uF) and resistor R5. The output from amplifier U2C is provided to transducer 24R by way of PTT on switch 46. Supply voltage is provided to the positive input terminal of amplifier U2C using resistor R16 (10K) and capacitor C17 (0.001uF) connected as shown.

The loudness of the side tone can be switched between two levels using the subcircuit composed of switch SW2, resistors R6 (120K), R9 (240K) and R20 (10K), capacitors C3 (390pF) and C25 (180pF) and device D1 (type SMT-DBAV99). Switch SW2 allows the user to switch between two levels (90 dB and 95 dB) of loudness for the side tone depending upon the level of ambient noise. That is, it is critical that the maximum power output (MPO) be limited so that the sound pressure level (SPL) to which the wearer is exposed is limited to a maximum of 95 dB in order to meet safety standards and protect the wearer's hearing.

Transmissions can also be triggered using VOX device U3. With manual PTT switch 42 open, when the user of apparatus 10 speaks, transducer 24L delivers audio signals representative of the person speaking to amplifier U2B as discussed above. The audio signals from amplifier U2B are delivered to terminal IN of VOX device U3 by way of resistor R21 (10K) and capacitor C19 (0.1uF). In response, terminal OUT2 goes logic high to gate U6B. Assuming VOX device U4 is not disabling transmission, the output from gate U6B goes logic low which causes the output from gate U6A to go logic high thereby changing the state of PTT switches 44–48. Transmission operations then proceed in the manner discussed above in connection with the operation of manual PTT switch 42.

Capacitor C28 (10uF) is connected to terminal CREC of VOX device U3 and provides for a two second delay on drop out in the same manner as discussed above with VOX device U4. This allows for two second pauses in speaking while keeping the VOX circuit triggered. Resistor R8 (100K) is connected between the GAIN and AMP terminals and is a variable resistor manually adjustable by the user for changing the VOX sensitivity to triggering. This allows fine control so that attenuated ambient sound present in the ear canal of the user does not trigger the VOX unit. In this way, the attenuation of ambient sound by ear units 12L,R and specifically ear pieces 22L,R is sufficient to prevent VOX triggering.

Having thus described the preferred embodiment of the present invention, the following is claimed as new and desired to be secured by Letters Patent:

1. A communications apparatus comprising:
   first and second ear units configured for placement in the respective ears of a person and including first and second transducers respectively
   at least one of said transducers including earphone means for receiving audio signals, converting said audio signals to audible sound, and for delivering said audible sound to the respective ear canal of the person,
   at least one of said transducers including microphone means for receiving audible sound and converting said audible sound to audio signals; and
   a control unit including
   means for coupling with said transducers,
   means for coupling with a radio transceiver for receiving audio signals therefrom and for delivering audio signals so received to at least one of said transducers, and a VOX circuit including means for triggering in response to audio signals from at least one of said transducers and for delivering audio signals so received to a transceiver coupled therewith for radio transmission thereby,
   means for maintaining said VOX circuit in a trigger condition for a predetermined time of about two seconds after cessation of audio signals received from said at least one of said transducers,
   said ear units including respective ear pieces each including means for attenuating ambient sound by at least about 20 decibels and for attenuating ambient sound sufficiently to prevent triggering of said VOX circuit by attenuated ambient sound present in the ear canal of the person,
   said first transducer being operable as said microphone means, said second transducer being operable as said earphone means, said control unit including means for delivering audio signals representative of the person speaking and received from said first transducer simultaneously to a radio transceiver coupled therewith and to said second transducer as a side tone.

2. The apparatus as set forth in claim 1, both of said transducers being operable as said microphone means.

3. The apparatus as set forth in claim 1, said control unit including means for controlling the volume of said side tone.

4. The apparatus as set forth in claim 1, said ear units including respective ear pieces with said transducers received therein respectively, each of said ear pieces being custom configured for conforming to the ear of the person and including structure for preventing any unattenuated sound from reaching the ear canal of the person.

5. The apparatus as set forth in claim 1, said control unit including means for preventing triggering of said VOX circuit during the reception of audio signals from a radio transducer coupled therewith.

6. The apparatus as set forth in claim 1, said control unit including a battery for supplying power thereto.

7. The apparatus as set forth in claim 1, said control unit including means for receiving operating power from a radio transceiver coupled therewith.

8. The apparatus as set forth in claim 7, said control unit including a battery for supplying power thereto and means for selecting between power from said battery and power from a radio transducer coupled therewith.

9. The apparatus as set forth in claim 1, said control unit including means for adjusting the sensitivity of said VOX circuit.

10. The apparatus as set forth in claim 1, said control unit including means for preventing the audible sound delivered by said transceiver from exceeding 95 decibels sound pressure level at the ear canal of a person wearing said ear pieces.

11. A communications apparatus comprising:

first and second ear units configured for placement in the respective ears of a person and including first and second transducers respectively at least one of said transducers including earphone means for receiving audio signals, converting said audio signals to audible sound, and for delivering said audible sound to the respective ear canal of the person, at least one of said transducers including microphone means for receiving audible sound and converting said audible sound to audio signals; and a control unit including
   means for coupling with said transducers,
   means for coupling with a radio transceiver for receiving audio signals therefrom and for delivering audio signals so received to at least one of said transducers, and
   a VOX circuit including means for triggering in response to audio signals from at least one of said transducers and for delivering audio signals so received to a transceiver coupled therewith for radio transmission thereby, said ear units including respective ear pieces each including means for attenuating ambient sound by at least about 20 decibels and for attenuating ambient sound sufficiently to prevent triggering of said VOX circuit by attenuated ambient sound present in the ear canal of the person, said control unit including means for triggering of said VOX circuit during the reception of audio signals from a radio transducer coupled therewith and for a predetermined time of about two seconds thereafter.

12. A communications apparatus comprising:

first and second ear units configured for placement in the respective ears of a person and including first and second transducers respectively, at least one of said transducers including an earphone, at least one of said transducers including a microphone, a control unit including:
   an input/output port capable of being coupled to said transducers,
   a radio transceiver input port,
   a radio transceiver output port,
   an audio signal conduction path coupling said radio transceiver input port to said input/output port,
   a VOX circuit connected to activate in response to audio signals received from said microphone and to deliver said audio signals to said radio transceiver,
   a modified OR gate coupled to prevent said VOX circuit from triggering when said control unit is receiving audio signals from said radio transceiver, and said ear units including respective form fitting ear pieces capable of attenuating ambient sound by at least about 20 decibels.

13. The apparatus as set forth in claim 12, wherein said form fitting ear pieces are comprised of medical grade silicone.

14. The apparatus as set forth in claim 12, said control unit including a sidetone amplifier coupled to deliver audio signals received from said microphone in a feedback path to said earphone.

15. The apparatus as set forth in claim 14, said control unit including a loudness control circuit coupled to control the gain of said sidetone amplifier.

16. The apparatus as set forth in claim 12, only said first transducer including a microphone configured to operate, and said second transducer including an earphone configured to operate.

17. The apparatus as set forth in claim 12, both of said transducers including microphones configured to operate.

18. The apparatus as set forth in claim 12, said control unit including a power port capable of being connected to receive power from said radio transceiver.

19. The apparatus as set forth in claim 12, said control unit including a battery and a switching circuit capable of selecting between power from said battery or from said power input port.

* * * * *